United States Patent [19]

Kuwajima et al.

[11] Patent Number: 5,238,911
[45] Date of Patent: Aug. 24, 1993

[54] OXIDE SUPERCONDUCTOR BI—SR—CA—MG—BA—CU—O

[75] Inventors: Hidegi Kuwajima; Keiji Sumiya; Shuichiro Shimoda; Toranosuke Ashizawa; Minoru Ishihara, all of Katsuta; Shozo Yamana, Hitachi, all of Japan

[73] Assignee: Hitachi Chemical Company Ltd., Tokyo, Japan

[21] Appl. No.: 679,318

[22] Filed: Apr. 2, 1991

[30] Foreign Application Priority Data

Apr. 4, 1990 [JP] Japan .................. 2-089617
Sep. 12, 1990 [JP] Japan .................. 2-242243

[51] Int. Cl.$^5$ .................. C01F 5/00; C01F 11/02; C01G 3/02; H01L 39/12
[52] U.S. Cl. .................. 505/1; 252/521; 505/782
[58] Field of Search .................. 505/1, 782; 252/521

[56] References Cited

FOREIGN PATENT DOCUMENTS

| | | |
|---|---|---|
| 0348986 | of 0000 | European Pat. Off. . |
| 0336621 | 10/1989 | European Pat. Off. . |
| 1-201024 | 8/1989 | Japan . |
| 1-201027 | 8/1989 | Japan . |
| 1-203254 | 8/1989 | Japan . |
| 1-212228 | 8/1989 | Japan . |
| 0215720 | 8/1989 | Japan .................. 505/782 |
| 1-2011025 | 8/1989 | Japan . |
| 2307827 | 12/1990 | Japan . |

OTHER PUBLICATIONS

Schrodt "Properties of Bi—Sr—Ca—Cu—O ..." *Solid State Comm* v. 67 (9) 1988 pp. 871–874.
Dou "Superconductivity in the Bi—Pb—Sr—Ca—Cu—O System w/ Oxide Additive" *Supercond. Sci. Technol.* 2 (1989).
Kawai "Effect of Ba Addition on the Properties of Bi—Pb—Sr—Ca—Cu—O ..." *Jap. Jnl. Appl. Physics* v. 27(12) Dec. 1988 pp. L2296–L2299.
Kawai "Dupont Effects on the Superconductivity in the Bi—Sr—Ca—Cu—O System" *Jap. Jnl. Appl. Phys.* 25 v. 28 (4) Apr. 1989 pp. L551–L554.
Zuyao "Superconductivity in the (Bi,Pb)—Ca—Ar—Ba—Cu—O System" *Solid State Comm.* v. 70 No. 2 1989 pp. 133–135.
Japanese Journal of Applied Physics, Letters vol. 28, No. 07, Jul. 1989, Tokyo, Japan, pp. 1140–1143; T. Aschizawa et al; "Variation of Composition in a Bi(Pb)—Sr—Ca—Cu—O Grain and the Influence of Jg and Ba doping on its Superconductivity".
Reviews of Solid State Science, Prooc. Int. Conf. on High Temp. Supercond. Srinagar India, 2–3 May 1988, vol. 2. No. 2 and 3, pp. 34–49; L. Gananpathi et al.; "Investigations of the Bi—Ca—Sr—Cu—L High Temperature Superconductors".
Journal of Crystal Growth. vo. 96, No. 2, Jun. 1989, Amsterdam NL, pp. 459–464; H. Jaeger et al.; "Processing and Superconducting Properties of Bi—Sr—Ca—Cu—O Compounds".

*Primary Examiner*—Paul Lieberman
*Assistant Examiner*—John Boyd
*Attorney, Agent, or Firm*—Antonelli, Terry, Stout & Kraus

[57] ABSTRACT

An oxide superconductor of the formula: $Bi_{1.0}Sr_ACa_BMg_CBa_DCu_{1.0\pm0.15}O_X$ wherein $A=0.6–1.3$, $B=0.3–0.9$, $C=0.01–0.3$ and $D=0.01–0.3$ in atomic ratio, having a 2212 phase with a critical temperature of making electrical resistance zero at about 80K or more, can be produced by firing preferably at 820°–870° C. in a lower oxygen content atmosphere.

1 Claim, No Drawings

OXIDE SUPERCONDUCTOR BI—SR—CA—MG—BA—CU—O

BACKGROUND OF THE INVENTION

The present invention relates to an oxide superconductor and a process for production thereof.

Conventional oxide superconductors include Bi—Sr—Ca—Cu—O system (hereinafter referred to as Bi system) oxide superconductors containing bismuth, strontium, calcium and copper as main elements, which were found in 1988 by Maeda, general researcher, and others of National Research Institute for Metals. These Bi system oxide superconductors have a problem in that it is difficult to form single phase of the 2223 phase which shows a critical temperature (a temperature at which the electrical resistance becomes zero) (hereinafter referred to as $T_c^{zero}$) of about 110K. Therefore, there are generally known Bi system oxide superconductors utilizing the 2212 phase which shows a low $T_c^{zero}$ of about 80K but which can be formed in a wide temperature region.

The above Bi system oxide superconductors utilizing the 2212 phase, however, have a problem in that as compared with Y—Ba—Cu—O system (hereinafter referred to as Y system) oxide superconductors, the Bi system oxide superconductors tend to show reduction in critical current density (hereinafter referred to as Jc) when a magnetic field has been applied thereto. Accordingly, the Bi system oxide superconductors are disadvantageous in application to a superconducting electromagnet and a superconducting magnetic shielding material.

SUMMARY OF THE INVENTION

An object of the present invention is to provide a Bi system oxide superconductor which, as compared with the conventional Bi system oxide superconductors utilizing the 2212 phase, shows small reduction in Jc when a magnetic field is applied and which has the same $T_c^{zero}$ as the conventional 2212 phase, as well as a process for production thereof.

According to the present invention, there is provided an oxide superconductor comprising bismuth, strontium, calcium, magnesium, barium and copper as main elements and having a composition represented by the formula:

$$Bi_{1.0}Sr_ACa_BMg_CBa_DCu_{1.0\pm0.15}O_X \quad (I)$$

wherein A=0.6–1.3, B=0.3–0.9, C=0.01–0.3 and D=0.01–0.3 in which each numeral represents an atomic ratio.

The present invention further provides a process for producing an oxide superconductor, which comprises weighing starting materials containing bismuth, strontium, calcium, magnesium, barium and copper, mixing the materials, calcining the mixture, grinding the calcined material, molding the ground material and firing the molded material.

DESCRIPTION OF THE PREFERRED EMBODIMENTS

The present inventors made study on the above-mentioned drawbacks and, as a result, had a thought that in order to allow an oxide superconductor to keep a superconducting state over a long period of time in a magnetic field without reducing its Jc, it would be effective to form pinning sites (e.g. impurities, additives, lattice defects) in the superconductor to stop the free movement of magnetic flux. As a result of further study, the present inventors had a thought that if strains, defects, etc. of crystal lattices could be formed by substitution of elements of oxide superconductor, they would become pinning sites and allow an oxide superconductor to have improved properties in a magnetic field. As a result of still further study, the present inventors found that a Bi system oxide superconductor of the 2212 phase containing magnesium and barium gave less reduction in Jc when a magnetic field had been applied, than the conventional Bi system oxide superconductors. The present invention has been completed based on the above.

The starting materials containing bismuth, strontium, calcium, magnesium, barium and copper which are the main elements constituting the oxide superconductor of the present invention, are not particularly restricted. For example, at least one compound selected from oxide, carbonates, nitrates, oxalates, etc. is used for each element.

In the general formula $Bi_{1.0}Sr_ACa_BMg_CBa_DCu_{1.0\pm0.15}O_X$, the subscript A is 0.6–1.3 in terms of atomic ratio. When the subscript A is smaller than 0.6, the oxide superconductor has a low superconductor content and, moreover, it is difficult to allow the oxide superconductor to show an electrical resistance of zero stably at 77K or above. When the subscript A is larger than 1.3, a heterogeneous phase of, for example, glass and crystals other than superconductor tends to be formed, resulting in lowering in $T_c^{zero}$.

The subscript B is 0.3–0.9 in terms of atomic ratio. When B is smaller than 0.3, the oxide superconductor has a low superconductor content and, moreover, it is difficult to allow the oxide superconductor to show an electrical resistance of zero stably at 77K or above. When B is larger than 0.9, a heterogeneous phase of, for example, glass and crystals other than superconductor tends to be formed resulting in lowering in $T_c^{zero}$.

The subscripts C and D are each 0.01–0.3 in terms of atomic ratio. When they are smaller than 0.01, no striking effect is obtained in change of Tc. When they are larger than 0.3, a heterogeneous phase of, for example, $BaCuO_2$ and $BaBiO_2$ tends to be formed.

In the present invention, the amount of O (oxygen) is determined by the amount and oxidation state of Cu. Since the oxidation state cannot be measured strictly and accurately, the oxygen amount is expressed by X ($0<X<9$) in the present invention and can be determined secondarily based on the amounts of other elements.

The oxide superconductor of the present invention can be produced by weighing starting materials so as to give a desired composition, mixing them, calcining the mixture, grinding the calcined material, molding the ground material and firing the molded material.

There is no particular restriction in the method for mixing the starting materials. However, the mixing is preferably effected, for example, by feeding starting materials, a solvent (e.g. ethanol, methanol) and synthetic resin-coated balls in a ball mill made of a synthetic resin and wet-mixing them.

The calcination conditions are determined as follows. The calcination temperature can be appropriately determined by the properties of starting materials, etc. but is preferably 780°–870° C. The calcination atmosphere has no particular restriction and can be the air, an oxygen atmosphere, a vacuum, a reducing atmosphere, a neutral atmosphere or the like.

The grinding and the molding have no particular restriction, either, and are each effected according to a known method.

The firing conditions are determined as follows. The firing temperature can be appropriately determined by the proportions of starting materials, etc. but is preferably 820°–870° C. The firing atmosphere is preferably the air, an air flowing, or an atmosphere of low oxygen partial pressure (oxygen content: 1–20% by volume, preferably 2–20% by volume).

Meanwhile, as a method for elevating the $T_c^{zero}$ of the 2212 phase, there is reported a method comprising heat-treating the 2212 phase at 500°–880° C. and then quenching the resulting phase in liquid nitrogen or air, as disclosed in Japanese Journal of Applied Physics, Vol 27, No. 9 (issued in September, 1988), L1626–L1628; the same Journal, Vol. 27, No. 12 (issued in December, 1988), L2327–L2329; and Advances in Superconductivity II, pp. 149–152 (1989). However, comprising a step of quenching, the method has a difficulty in producing a large-sized molded material, although the method enables production of a small-sized molded material.

This drawback can be overcome by determining the proportions of elements, particularly the atomic ratios A to D in the oxide superconductor of the formula (I), as follows.

Bi: 1.0
Sr: A=0.6–1.2
Ca: B=0.35–0.7
Mg: C=0.05–0.2
Ba: D=0.05–0.2
Cu: 1.0±0.2

When the proportions of elements deviated from the above ranges, it is difficult to produce, without adopting the quenching step, a Bi system oxide superconductor having the 2212 phase which gives a $T_c^{zero}$ of 90K order.

The oxide superconductor having such a composition can be produced by a process which is for the most part the same as employed in producing an oxide superconductor of the formula (I) but which is slightly different therefrom in the final firing conditions.

That is, the firing temperature can be appropriately determined by the proportions of starting materials, etc. but is preferably in the vicinity (e.g. 780°–950° C.) of the melting temperatures of the starting materials, more preferably 810°–900° C.

The firing atmosphere, when the firing is effected once, is required to be a nitrogen atmosphere or a nitrogen atmosphere containing oxygen in an amount of less than 10% by volume. When the firing is effected twice, the primary firing can be effected in any atmosphere such as air, oxygen atmosphere, vacuum, reducing atmosphere, neutral atmosphere or the like; while, the secondary firing is required to be effected in a nitrogen atmosphere or a nitrogen atmosphere containing oxygen in an amount of less than 7% by volume. When the firing is effected under conditions other than mentioned above, it is difficult to produce, without adopting the quenching step, a Bi system oxide superconductor having the 2212 phase which gives a $T_c^{zero}$ of 90K order. In the present invention, it is possible to effect, as necessary, grinding and molding after the calcination and then effect primary firing.

The firing time may be 5–10 hours but, in order to obtain crystals with higher homogeneity, is preferably 20–100 hours.

The present invention is hereinafter described in more detail by way of examples.

EXAMPLES 1–5

There were weighed, as starting materials, bismuth trioxide (purity: 99.9%, manufactured by Kojundo Kagaku Kenkyusho Co.), strontium carbonate (purity: 99.9%, manufactured by Rare Metallic Co.), magnesium oxide (purity: 99.9%, manufactured by Kojundo Kagaku Kenkyusho Co.), barium carbonate (purity: 99.9%, manufactured by Kojundo Kagaku Kenkyusho Co.), calcium carbonate (purity: 99.9%, manufactured by Kojundo Kagaku Kenkyusho Co.), cupric oxide (purity: 99.9%, manufactured by Kojundo Kagaku Kenkyusho Co.) so that the proportions (in terms of atomic ratio) of bismuth, strontium, magnesium, barium, calcium and copper became a composition shown in Table 1.

These starting materials were fed, together with methanol and steel balls coated with a synthetic resin, into a ball mill made of a synthetic resin. The contents in the ball mill were wet mixed at 50 r.p.m. for 72 hours. After drying, the mixture was placed in an alumina saggar and calcined in the air at 800° C. for 10 hours using an electric furnace. The calcined material was ground roughly in a mortar to obtain compositions for oxide superconductor. Each composition for oxide superconductor was press molded into pellets of 30 mm in diameter and 1 mm in thickness, at a pressure of 147 MPa. The pellets were fired in a low-oxygen content atmosphere ($O_2:N_2=1:1$ by volume ratio) at 845° C. for 100 hours to obtain Bi system oxide superconductors. The oxide superconductors were measured for $T_c^{zero}$ and Jc in magnetic field by conventional four-probe method. The results are shown in Table 3.

COMPARATIVE EXAMPLES 1–5

Starting materials were weighed so that the proportions (in terms of atomic ratio) of bismuth, strontium, calcium and copper became a composition shown in Table 2. The subsequent operation was conducted in the same manner as in Examples 1–5, to obtain Bi system oxide superconductors. They were evaluated in the same manner as in Examples 1–5. The results are shown in Table 3.

TABLE 1

| Element<br>Starting material | Bi<br>$Bi_2O_3$ | Sr<br>$SrCO_3$ | Mg<br>MgO | Ba<br>$BaCO_3$ | Ca<br>$CaCO_3$ | Cu<br>CuO |
|---|---|---|---|---|---|---|
| Example 1 | | | | | | |
| Atomic ratio | 1.0 | 0.6 | 0.01 | 0.3 | 0.9 | 1.0 |
| Amount used (g) | 42.30 | 16.08 | 0.07 | 10.75 | 16.36 | 14.44 |
| Example 2 | | | | | | |
| Atomic ratio | 1.0 | 0.8 | 0.08 | 0.2 | 0.7 | 1.1 |
| Amount used (g) | 42.26 | 21.42 | 0.59 | 7.16 | 12.71 | 15.87 |
| Example 3 | | | | | | |
| Atomic ratio | 1.0 | 1.0 | 0.15 | 0.15 | 0.65 | 1.0 |
| Amount used (g) | 41.54 | 26.32 | 1.08 | 5.28 | 11.60 | 14.18 |
| Example 4 | | | | | | |
| Atomic ratio | 1.0 | 1.2 | 0.2 | 0.08 | 0.5 | 0.9 |
| Amount used (g) | 41.93 | 31.88 | 1.45 | 2.84 | 9.01 | 12.88 |
| Example 5 | | | | | | |
| Atomic ratio | 1.0 | 1.3 | 0.3 | 0.01 | 0.3 | 1.1 |
| Amount used (g) | 41.87 | 34.49 | 2.17 | 0.355 | 5.40 | 15.72 |

TABLE 2

| Element<br>Starting material | Bi<br>$Bi_2O_3$ | Sr<br>$SrCO_3$ | Ca<br>$CaCO_3$ | Cu<br>CuO |
|---|---|---|---|---|
| Comparative Example 1 | | | | |
| Atomic ratio | 1.0 | 0.6 | 0.9 | 1.0 |
| Amount used (g) | 47.43 | 18.03 | 18.34 | 16.20 |
| Comparative Example 2 | | | | |
| Atomic ratio | 1.0 | 0.8 | 0.7 | 1.1 |
| Amount used (g) | 45.80 | 23.22 | 13.77 | 17.20 |
| Comparative Example 3 | | | | |
| Atomic ratio | 1.0 | 1.0 | 0.65 | 1.0 |
| Amount used (g) | 44.36 | 28.11 | 12.39 | 15.15 |
| Comparative Example 4 | | | | |
| Atomic ratio | 1.0 | 1.2 | 0.5 | 0.9 |
| Amount used (g) | 43.81 | 33.31 | 9.41 | 13.46 |
| Comparative Example 5 | | | | |
| Atomic ratio | 1.0 | 1.3 | 0.3 | 1.1 |
| Amount used (g) | 42.95 | 35.38 | 5.54 | 16.13 |

TABLE 3

| | $T_c^{zero}$ (K) | Jc (A/cm, at 77K) when a magnetic filled has been applied | | | |
|---|---|---|---|---|---|
| | | 0T | $10^{-3}$T | $10^{-2}$T | $10^{-1}$T |
| Example 1 | 83 | 750 | 741 | 727 | 710 |
| Example 2 | 82 | 756 | 746 | 729 | 712 |
| Example 3 | 83 | 749 | 739 | 722 | 708 |
| Example 4 | 83 | 753 | 744 | 727 | 707 |
| Example 5 | 82 | 765 | 741 | 727 | 703 |
| Comparative Example 1 | 81 | 750 | 451 | 186 | 93 |
| Comparative Example 2 | 82 | 751 | 421 | 163 | 76 |
| Comparative Example 3 | 82 | 749 | 400 | 97 | 50 |
| Comparative Example 4 | 81 | 751 | 458 | 175 | 78 |
| Comparative Example 5 | 83 | 753 | 461 | 178 | 80 |

As is clear from Table 3, the Bi system oxide superconductors of Examples 1-5 according to the present invention show slight reduction in Jc when a magnetic field has been applied, and give a $T_c^{zero}$ of 82K of more similarly to the conventional 2212 phase. Meanwhile, the conventional Bi system oxide superconductors give a $T_c^{zero}$ of 81K or more similarly to the conventional 2212 phase, but show significant reduction in Jc when a magnetic field has been applied.

EXAMPLES 6 AND 7

The procedures of Examples 1-5 were repeated except that the proportions of starting materials were changed as shown in Table 4 and that the firing was effected at 840° C. in a low-oxygen content atmosphere ($O_2:N_2=1:20$ by volume ratio).

The resulting Bi system oxide superconductors were measured for $T_c^{zero}$ by four-probe method. The results are shown in Table 8.

TABLE 4

| Element<br>Starting material | Bi<br>$Bi_2O_3$ | Sr<br>$SrCO_3$ | Mg<br>MgO | Ba<br>$BaCO_3$ | Ca<br>$CaCO_3$ | Cu<br>CuO |
|---|---|---|---|---|---|---|
| Example 6 | | | | | | |
| Atomic ratio | 1.0 | 0.6 | 0.1 | 0.2 | 0.6 | 1.0 |
| Amount used (g) | 42.30 | 16.08 | 0.72 | 7.2 | 10.9 | 14.44 |
| Example 7 | | | | | | |
| Atomic ratio | 1.0 | 0.8 | 0.08 | 0.2 | 0.5 | 1.1 |
| Amount used (g) | 42.26 | 21.42 | 0.59 | 7.16 | 9.01 | 15.87 |

EXAMPLES 8-9

The same starting materials as used in Examples 6 and 7 were weighed so that the proportions (in terms of atomic ratio) of bismuth, strontium, magnesium, barium, calcium and copper became a composition shown in Table 5.

The subsequent operation was conducted in the same manner as in Examples 6 and 7 to obtain compositions for oxide superconductor. Each composition was subjected to primary firing in an oxygen atmosphere at 900° C. for 15 hours. The resulting material was ground and then press molded into pellets of 30 mm in diameter and 1 mm in thickness, at a pressure of 147 MPa. The molded material was subjected to secondary firing at 830° C. for 100 hours in a low-oxygen content atmosphere ($O_2:N_2=1:20$) to obtain Bi system oxide superconductors.

TABLE 5

| Element<br>Starting material | Bi<br>$Bi_2O_3$ | Sr<br>$SrCO_3$ | Mg<br>MgO | Ba<br>$BaCO_3$ | Ca<br>$CaCO_3$ | Cu<br>CuO |
|---|---|---|---|---|---|---|
| Example 8 | | | | | | |
| Atomic ratio | 1.0 | 1.0 | 0.15 | 0.15 | 0.55 | 1.0 |
| Amount used (g) | 41.54 | 26.32 | 1.08 | 5.28 | 9.82 | 14.18 |
| Example 9 | | | | | | |
| Atomic ratio | 1.0 | 1.2 | 0.2 | 0.08 | 0.5 | 0.9 |
| Amount used (g) | 41.93 | 31.88 | 1.45 | 2.84 | 9.01 | 12.88 |

COMPARATIVE EXAMPLES 6-7

There were weighed, as starting materials, bismuth trioxide (purity: 99.9%, manufactured by Kojundo Kagaku Kenkyusho Co.), strontium carbonate (purity: 99.9%, manufactured by Rare Metallic Co.), calcium carbonate (purity: 99.9%, manufactured by Kojundo Kagaku Kenkyusho Co.) and cupric oxide (purity: 99.9%, manufactured by Kojundo Kagaku Kenkyusho Co.) so that the proportions (in terms of atomic ratio) of bismuth, strontium, calcium and copper became a composition shown in Table 6. The subsequent operation was conducted in the same manner as in Examples 6-7 to obtain Bi system oxide superconductors.

TABLE 6

| Element<br>Starting material | Bi<br>$Bi_2O_3$ | Sr<br>$SrCO_3$ | Ca<br>$CaCO_3$ | Cu<br>CuO |
|---|---|---|---|---|
| Comparative Example 6 | | | | |
| Atomic ratio | 1.0 | 0.6 | 0.9 | 1.0 |
| Amount used (g) | 47.43 | 18.03 | 18.34 | 16.20 |
| Comparative Example 7 | | | | |
| Atomic ratio | 1.0 | 0.8 | 0.7 | 1.1 |
| Amount used (g) | 45.80 | 23.22 | 13.77 | 17.20 |

COMPARATIVE EXAMPLES 8-9

The same starting materials as used in Comparative Examples 6-7 were weighed so that the proportions (in terms of atomic ratio) of bismuth, strontium, calcium and copper became a composition shown in Table 7.

The subsequent operation was conducted in the same manner as in Examples 8-9 to obtain Bi system oxide superconductors.

TABLE 7

| Element<br>Starting material | Bi<br>$Bi_2O_3$ | Sr<br>$SrCO_3$ | Ca<br>$CaCO_3$ | Cu<br>CuO |
|---|---|---|---|---|
| Comparative Example 8 | | | | |
| Atomic Ratio | 1.0 | 1.0 | 0.65 | 1.0 |

TABLE 7-continued

| Element | Bi | Sr | Ca | Cu |
|---|---|---|---|---|
| Starting material | Bi₂O₃ | SrCO₃ | CaCO₃ | CuO |
| Amount used (g) | 44.36 | 28.11 | 12.39 | 15.15 |
| Comparative Example 9 | | | | |
| Atomic ratio | 1.0 | 1.2 | 0.5 | 0.9 |
| Amount used (g) | 43.81 | 33.31 | 9.41 | 13.46 |

The Bi system oxide superconductors obtained in Examples 6-9 and Comparative Examples 6-9 were measured for $T_c^{zero}$ by four-probe method. The results are shown in Table 8.

TABLE 8

| | $T_c^{zero}$ (K) |
|---|---|
| Example 6 | 91 |
| Example 7 | 90 |
| Example 8 | 92 |
| Example 9 | 92 |
| Comparative Example 6 | 81 |
| Comparative Example 7 | 82 |
| Comparative Example 8 | 80 |

TABLE 8-continued

| | $T_c^{zero}$ (K) |
|---|---|
| Comparative Example 9 | 79 |

As shown in Table 8, the oxide superconductors of Examples 6-9 according to the present invention have a $T_c^{zero}$ of 90K or more. Their crystalline phase was found by examination to be the 2212 phase.

Thus, it is possible to obtain an oxide superconductor of the 2212 phase showing a $T_c^{zero}$ of 90K or more, without employing a quenching step.

What is claimed is:

1. An oxide superconductor which is obtained by firing in a nitrogen atmosphere or a nitrogen atmosphere containing oxygen in an amount less than 10% by volume, said oxide superconductor comprising bismuth, strontium, calcium, magnesium, barium and copper as main elements, utilizing the 2212 phase, and having a composition represented by the formula:

$$Bi_{1.0}Sr_ACa_BMg_CBa_DCu_{1.0+0.15}O_X \qquad (I)$$

wherein A=0.6-1.2, B=0.35-0.7, C=0.05-0.2 and D=0.05-0.2 in which each numeral represents an atomic ratio and wherein O<X<9.

* * * * *